(12) United States Patent
Tomida

(10) Patent No.: US 8,237,690 B2
(45) Date of Patent: Aug. 7, 2012

(54) DISPLAY DEVICE, ELECTRO-OPTICAL ELEMENT DRIVING METHOD AND ELECTRONIC EQUIPMENT

(75) Inventor: Masatsugu Tomida, Kanagawa (JP)

(73) Assignee: Sony Corporation, Tokyo (JP)

( * ) Notice: Subject to any disclaimer, the term of this patent is extended or adjusted under 35 U.S.C. 154(b) by 1047 days.

(21) Appl. No.: 12/087,047

(22) PCT Filed: Nov. 6, 2007

(86) PCT No.: PCT/JP2007/071559
§ 371 (c)(1),
(2), (4) Date: Jun. 25, 2008

(87) PCT Pub. No.: WO2008/059732
PCT Pub. Date: May 22, 2008

(65) Prior Publication Data
US 2010/0220114 A1     Sep. 2, 2010

(30) Foreign Application Priority Data
Nov. 13, 2006 (JP) .................. 2006-306252

(51) Int. Cl.
*G09G 5/00* (2006.01)
*G09G 3/30* (2006.01)
(52) U.S. Cl. ............................ 345/204; 345/76; 345/206
(58) Field of Classification Search .............. 345/76–82, 345/204–207
See application file for complete search history.

(56) References Cited

U.S. PATENT DOCUMENTS

| 6,366,025 | B1 | 4/2002 | Yamada |
| 7,492,337 | B2* | 2/2009 | Fukase ............................ 345/76 |
| 2002/0036463 | A1* | 3/2002 | Yoneda et al. ................. 313/506 |
| 2003/0052597 | A1* | 3/2003 | Sakurai ......................... 313/504 |
| 2003/0095087 | A1* | 5/2003 | Libsch et al. ................... 345/82 |
| 2005/0087740 | A1* | 4/2005 | Matsumoto et al. ............ 257/72 |
| 2005/0231122 | A1* | 10/2005 | Osame et al. .............. 315/169.1 |
| 2005/0269959 | A1 | 12/2005 | Uchino et al. |

FOREIGN PATENT DOCUMENTS

| JP | 06-290872 | 10/1994 |
| JP | 11-345688 | 12/1999 |
| JP | 2001-290441 | 10/2001 |
| JP | 2005-345722 | 12/2005 |

OTHER PUBLICATIONS

Japanese Office Action issued Jan. 18, 2011 for corresponding Japanese Application No. 2006-306252.

* cited by examiner

*Primary Examiner* — Duc Dinh
(74) *Attorney, Agent, or Firm* — Rader Fishman & Grauer, PLLC

(57) ABSTRACT

The present invention permits a capacitance value of an electro-optical element such as organic EL element to be arbitrarily set without changing the light extraction efficiency of a pixel. That is, the present invention permits a capacitance value Coled of an organic EL element (21) to be arbitrarily set by adjusting the light emission area of the organic EL element (21) without changing the light extraction efficiency of a pixel (20) in an organic EL display device. The organic EL display device has the pixels (20) arranged in a matrix form. A light extraction opening (56) is formed on the surface of the pixel with a light-shielding film (black matrix) (57). The light extraction opening (56) has an opening area smaller than the light emission area of the organic EL element (21).

13 Claims, 9 Drawing Sheets

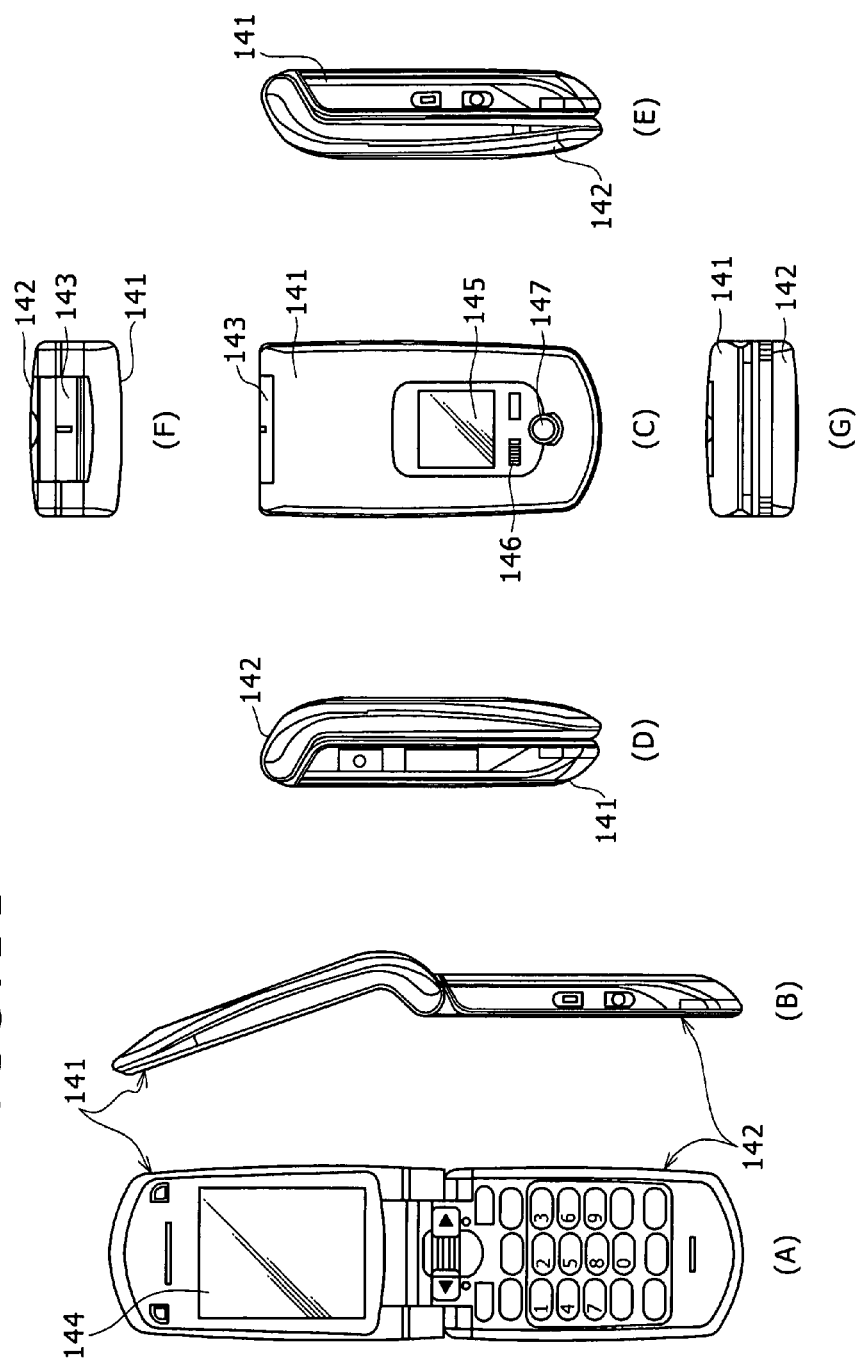

DISPLAY DEVICE, ELECTRO-OPTICAL ELEMENT DRIVING METHOD AND ELECTRONIC EQUIPMENT

TECHNICAL FIELD

The present invention relates to a display device having pixels, containing an electro-optical element, arranged in a matrix form, and to an electro-optical element driving method and electronic equipment.

BACKGROUND ART

In recent years, in the field of image display device for displaying images, organic EL display devices having a number of pixel circuits, containing an electro luminescence element, i.e., organic EL element, which is a so-called current-driven electro-optical element whose light emission brightness changes in accordance with current value flowing through the element, arranged in a matrix form have been developed and commercialized.

An organic EL element is self-luminous. As a result, an organic EL display device offers several advantages compared with a liquid crystal display device which controls the light intensity from the light source (backlight) by means of pixels, containing liquid crystal cells such as high image visibility, no need for backlight and high response speed of the element.

An organic EL display device can employ either a simple (passive)-matrix system or an active-matrix system driven as with a liquid crystal display device. It should be noted, however, that a simple matrix display device has some problems although simple in construction. Such problems include such as difficulty in implementing a large high-definition display device.

For this reason, in recent years, the development of active matrix display devices has been going on at a brisk pace. Such display devices control the current flowing through the electro-optical element with an active element such as insulating gate field effect transistor (typically, thin film transistor; TFT) provided in the same pixel circuit as the electro-optical element.

In an active matrix organic EL display device, a pixel (pixel circuit) at least includes, in addition to an organic EL element, a drive transistor adapted to drive the organic EL element, a write transistor adapted to sample an input signal voltage and write the voltage to the pixel, and a holding capacitance connected to the gate of the drive transistor to hold the input signal voltage written by the write transistor (refer, for example, to Japanese Patent Laid-Open Publication No. 2005-345722).

DISCLOSURE OF INVENTION

In the organic EL display device configured as described above, the drive transistor is designed to operate in the saturation region. Therefore, the drive transistor functions as a constant current source. As a result, a constant drain-to-source current Ids, given by the following formula (1), is supplied to the organic EL element whose anode electrode is connected to the source of the drive transistor:

$$Ids=(1/2)\cdot\mu(W/L)Cox(Vgs-Vth)^2 \quad (1)$$

where Vth is the threshold voltage of the drive transistor, μ the mobility of the semiconductor thin film making up the drive transistor's channel, W the channel width, L the channel length, Cox the gate capacitance per unit area, and Vgs the gate-to-source voltage applied to the gate relative to the source.

On the other hand, as a gate potential Vg of the drive transistor rises as a result of the writing of an input signal voltage Vsig by the write transistor through sampling, a source potential Vs of the drive transistor will rise because of the coupling of the holding capacitance and the capacitance of the organic EL element. Here, letting the capacitance value of the holding capacitance be denoted by Ccs, the capacitance value of the organic EL element by Coled and the increment of the gate potential Vg of the drive transistor by ΔVg, an increment ΔVs of the source potential Vs of the drive transistor is given by the following formula (2):

$$\Delta Vs=\Delta Vg\times\{Ccs/(Coled+Ccs)\} \quad (2)$$

As is clear from the formula (2), if the capacitance value Coled of the organic EL element is sufficiently larger than the capacitance value Ccs of the holding capacitance, the increment ΔVs of the source potential Vs of the drive transistor can be suppressed when the gate potential Vg of the drive transistor rises. That is, when sufficiently larger than the capacitance value Ccs of the holding capacitance, the capacitance value Coled of the organic EL element is advantageous in providing a large gate-to-source potential difference of the drive transistor.

The reason for this is as follows. That is, if a large gate-to-source potential difference of the drive transistor can be provided at the time of writing of the input signal voltage Vsig by the write transistor, the amplitude of the input signal voltage Vsig written to the pixel can be reduced to the same extent. Hence, power consumption of horizontal drive system adapted to supply the input signal voltage Vsig to each pixel via a signal line can be reduced. As a result, the display device as a whole can be reduced in power consumption.

In light of the foregoing, it is an object of the present invention to provide a display device which permits the capacitance value of the electro-optical element such as organic EL element to be arbitrarily set without changing the light extraction efficiency of the pixel, and to provide an electro-optical element driving method and electronic equipment.

A display device according to the present invention is characterized as follows. That is, pixels, containing an electro-optical element and light-shielding film, are arranged in a matrix form. The light-shielding film forms a light extraction opening whose opening area is smaller than the light emission area of the electro-optical element. The capacitance value of the electro-optical element is set by the light emission area of the electro-optical element.

An electro-optical element driving method according to the present invention is a driving method of an electro-optical element adapted to emit light according to the current. The electro-optical element driving method is characterized as follows. That is, the method drives a plurality of electro-optical elements and brings drive current value of each electro-optical element to approximately the same level by varying the light emission area between the electro-optical elements.

Electronic equipment according to the present invention is characterized in having a display device. In the display device, pixels, containing an electro-optical element and light-shielding film, are arranged in a matrix form. The light-shielding film forms a light extraction opening whose opening area is smaller than the light emission area of the electro-optical element. The capacitance value of the electro-optical element is set by the light emission area of the electro-optical element.

In the display device, electro-optical element driving method and electronic equipment configured as described above, the capacitance value of the electro-optical element is determined by the light-emitting material, the film thickness of the light-emitting layer, and the light emission area. For this reason, the capacitance value of the electro-optical element is set to an optimal value by adjusting the light emission area of the electro-optical element. In this case, the opening area of the light extraction opening formed by the light-shielding film is smaller than the light emission area of the electro-optical element. Therefore, even if the light emission area of the electro-optical element is changed, the light emission area of the pixel determined by the opening area of the light extraction opening, namely, the light extraction efficiency, will remain unchanged.

BRIEF DESCRIPTION OF DRAWINGS

FIG. 11 is a perspective view illustrating a mobile phone to which the present invention is applied, and (A) is a front view of the mobile phone in an open position, (B) is a side view thereof, (C) is a front view of the mobile phone in a closed discharge, (D) is a left side view, (E) is a right side view, (F) is a top view, and (G) is a bottom view.

BEST MODE FOR CARRYING OUT THE INVENTION

An embodiment of the present invention will be described in details with reference to the drawings.

Figure 1:
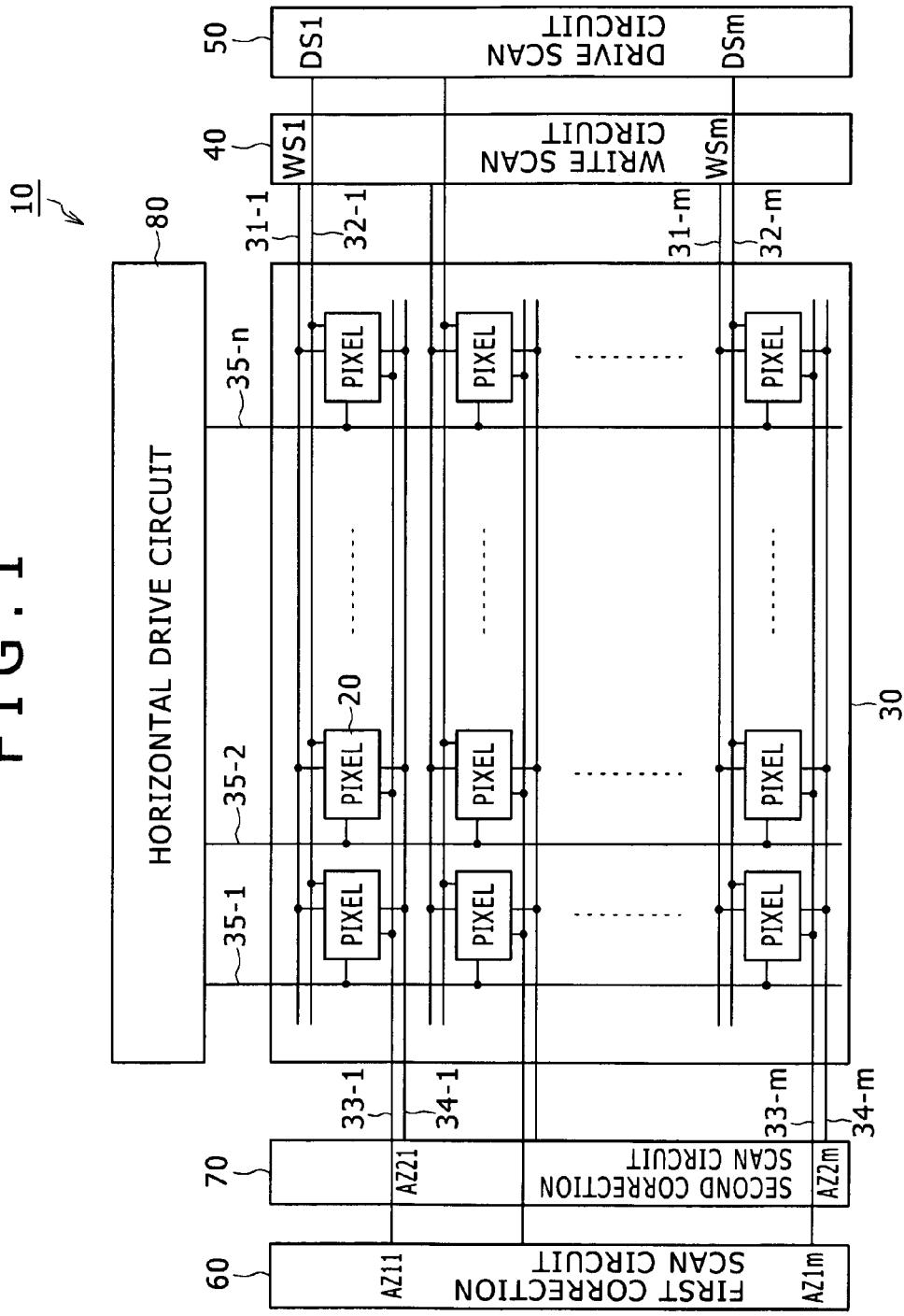
FIG. 1 is a system configuration diagram illustrating the outline of the configuration of an active matrix organic EL display device according to the present invention.

FIG. 1 is a system configuration diagram illustrating the outline of the configuration of an active matrix display device according to the present invention such as active matrix organic EL display device.

As illustrated in FIG. 1, an organic EL display device 10 according to the present invention includes a pixel array section 30. The pixel array section 30 has pixels (pixel circuits) 20 containing an electro luminescence element, i.e., organic EL element 21 (refer to FIG. 2) as a light emitting element, arranged two-dimensionally in a matrix form. The organic EL element 21 is a current-driven electro-optical element whose light emission brightness changes with change in current value flowing through the device.

The pixel array section 30 is typically formed on a transparent insulating substrate such as glass substrate. The pixel array section 30 has scan lines 31-1 to 31-$m$, drive lines 32-1 to 32-$m$ and first and second correction scan lines 33-1 to 33-$m$ and 34-1 to 34-$m$ for each of the pixels arranged in m rows by n columns. The pixel array section 30 also has signal lines (data lines) 35-1 to 35-$n$ for each pixel column.

Several circuits are disposed around the pixel array section 30. These circuits are a write scan circuit 40 adapted to scan and drive the scan lines 31-1 to 31-$m$, a drive scan circuit 50 adapted to scan and drive the drive lines 32-1 to 32-$m$, first and second correction scan circuits 60 and 70 adapted to scan and drive the first and second correction scan lines 33-1 to 33-$m$ and 34-1 to 34-$m$, and a horizontal drive circuit 80 adapted to supply a video signal (data signal, i.e., input signal) appropriate to brightness information to the signal lines 35-1 to 35-$n$.

To scan and drive the scan lines 31-1 to 31-$m$, drive lines 32-1 to 32-$m$ and first and second correction scan lines 33-1 to 33-$m$ and 34-1 to 34-$m$, the write scan circuit 40, drive scan circuit 50 and first and second correction scan circuits 60 and 70 output, as appropriate, write signals WS1 to WSm, drive signals DS1 to DSm and first and second correction scan signals AZ11 to AZ1$m$ and AZ21 to AZ2$m$.

Each of the pixels 20 of the pixel array section 30 can be formed with an amorphous silicon TFT (thin film transistor) or low-temperature polysilicon TFT. Here, a case will be described as an example where the pixels 20 are formed with low-temperature polysilicon TFTs. In the case where low-temperature polysilicon TFTs are used, the write scan circuit 40, drive scan circuit 50, first and second correction scan circuits 60 and 70 and horizontal drive circuit 80 can also be formed integrally on a panel (substrate) on which pixel array section 30 is formed.

(Pixel Circuit)

Figure 2:
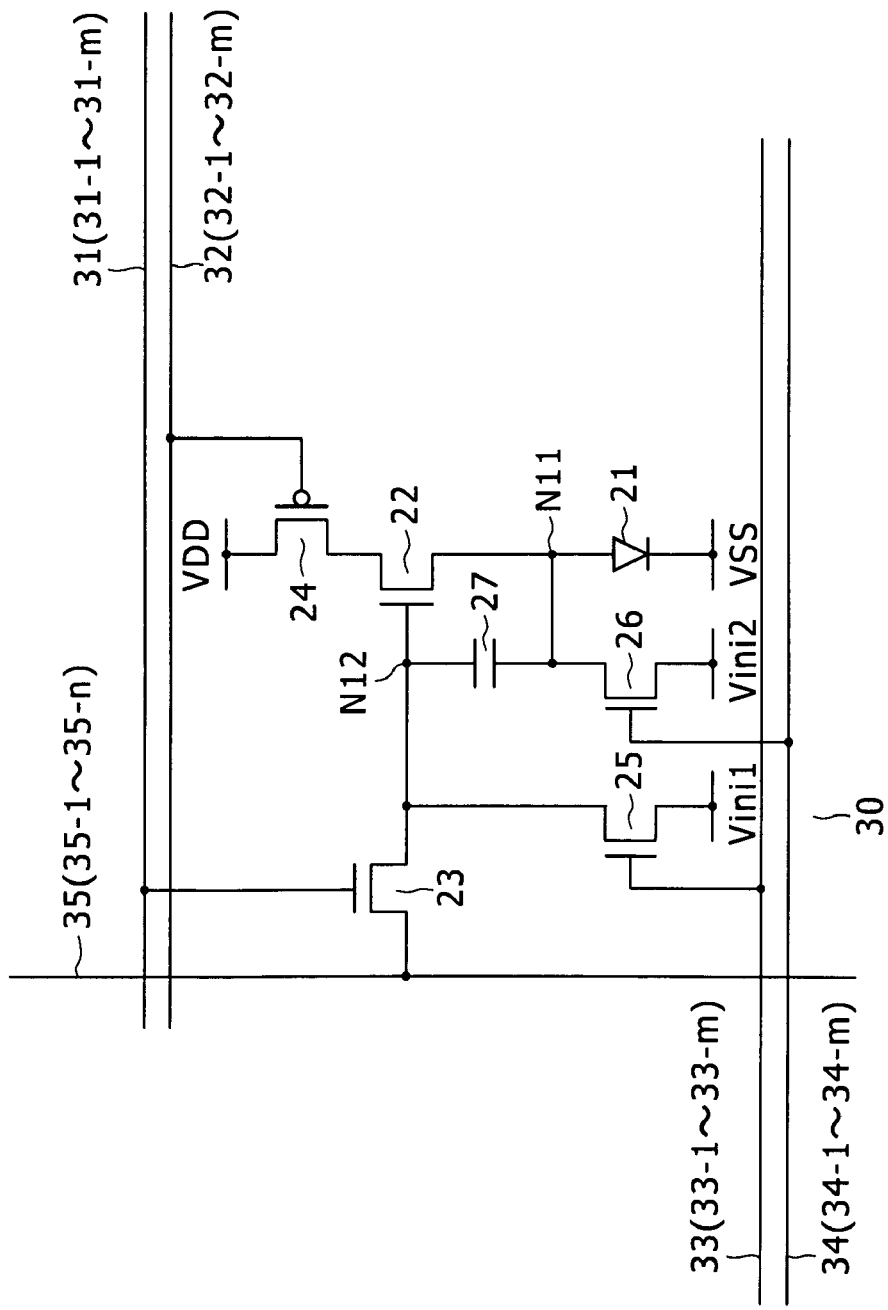
FIG. 2 is a circuit diagram illustrating an example of circuit configuration of a pixel (pixel circuit).

FIG. 2 is a circuit diagram illustrating an example of circuit configuration of the pixel (pixel circuit) 20. As illustrated in FIG. 2, the pixel 20 includes, in addition to the current-driven electro-optical element, i.e., organic EL element 21, a drive transistor 22, write (sampling) transistor 23, switching transistors 24 to 26 and holding capacitance 27, as its circuit components.

In the pixel 20 configured as described above, N-channel TFTs are used as the drive transistor 22, write transistor 23 and switching transistors 25 and 26. A P-channel TFT is used as the switching transistor 24. It should be noted, however, that the combination of conductivity types of the drive transistor 22, write transistor 23 and switching transistors 24 to 26 given here is merely an example, and the present invention is not limited to this combination.

Figure 3:
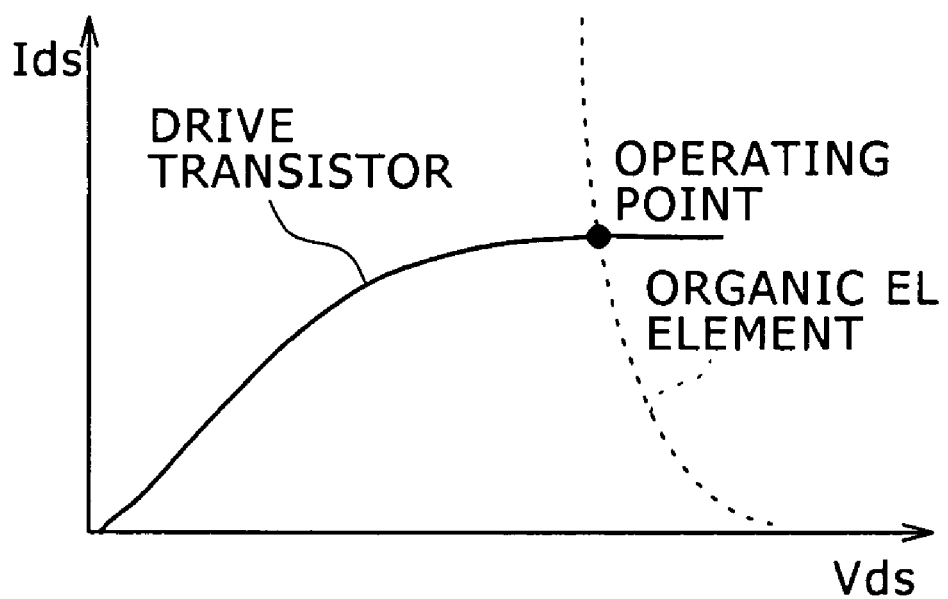
FIG. 3 is a characteristic diagram of a drain-to-source voltage Vds vs. drain-to-source current Ids of a drive transistor.

The organic EL element 21 has its cathode electrode connected to a source potential VSS (ground potential GND in this case). The drive transistor 22 is adapted to current-drive the organic EL element 21. The drive transistor 22 has its source connected to the anode electrode of the organic EL element 21, thus forming a source-follower circuit. That is, the source potential Vs of the drive transistor 22 is determined by the operating point between the drive transistor 22 and organic EL element 21 as illustrated in FIG. 3. The source potential Vs has a different voltage value depending on the gate potential Vg.

The write transistor 23 has its source connected to the signal line 35 (35-1 to 35-*n*), its drain connected to the gate of the drive transistor 22, and its gate connected to the scan line 31 (31-1 to 31-*m*). The switching transistor 24 has its source connected to a second source potential VDD (positive source potential in this case), its drain connected to the drain of the drive transistor 22, and its gate connected to the drive line 32 (32-1 to 32-*m*). The switching transistor 25 has its drain connected to a third source potential Vini1, its source connected to the drain of the write transistor 23 (gate of the drive transistor 22), and its gate connected to the first correction scan line 33 (33-1 to 33-*m*).

The switching transistor 26 has its drain connected to a connection node N11 between the source of the drive transistor 22 and the anode electrode of the organic EL element 21, its source connected to a fourth source potential Vini2 (negative source potential in this case), and its gate connected to the second correction scan line 34 (34-1 to 34-*m*). The holding capacitance 27 has one end connected to a connection node N12 between the gate of the drive transistor 22 and the drain of the write transistor 23. The holding capacitance 27 has the other end connected to the connection node N11 between the source of the drive transistor 22 and the anode electrode of the organic EL element 21.

In the pixel 20 whose components are connected according to the above connection relationship, each of the components serves the following function. That is, the write transistor 23 conducts to sample the input signal voltage Vsig supplied via the signal line 35 and write the input signal voltage Vsig to the pixel 20. The written input signal voltage Vsig is held by the holding capacitance 27. The switching transistor 24 conducts to supply a current to the drive transistor 22 from the source potential VDD.

When the switching transistor 24 is conducting, the drive transistor 22 supplies a current appropriate to the input signal voltage Vsig held by the holding capacitance 27 to the organic EL element 21, thus driving the same organic EL element 21 (current driving). The switching transistors 25 and 26 conduct as appropriate to detect the threshold voltage Vth of the drive transistor 22 ahead of the current driving of the organic EL element 21 and hold the detected threshold voltage Vth in the holding capacitance 27 so as to cancel the impact of the current driving in advance. The holding capacitance 27 holds the gate-to-source potential difference of the drive transistor 22 over the display period.

As a condition to guarantee the proper operation of the pixel 20, the fourth source potential Vini2 is set lower than the potential obtained by subtracting the threshold voltage Vth of the drive transistor 22 from the third source potential Vini1. That is, the level relationship, Vini2<Vini1−Vth, holds. Further, the level obtained by adding a threshold voltage Vthel of the organic EL element 21 to a cathode potential Vcat (ground potential GND in this case) of the organic EL element 21 is set higher than the level obtained by subtracting the threshold voltage Vth of the drive transistor 22 from the third source potential Vini1. That is, the level relationship, Vcat+Vthel>Vini1−Vth (>Vini2), holds.

[Description of the Circuit Operation]

A description will be given next of the circuit operation of the active matrix organic EL display device 10 having the pixels 20 configured as described above arranged two-dimensionally in a matrix form with reference to the timing waveform diagram in FIG. 4.

Figure 4:
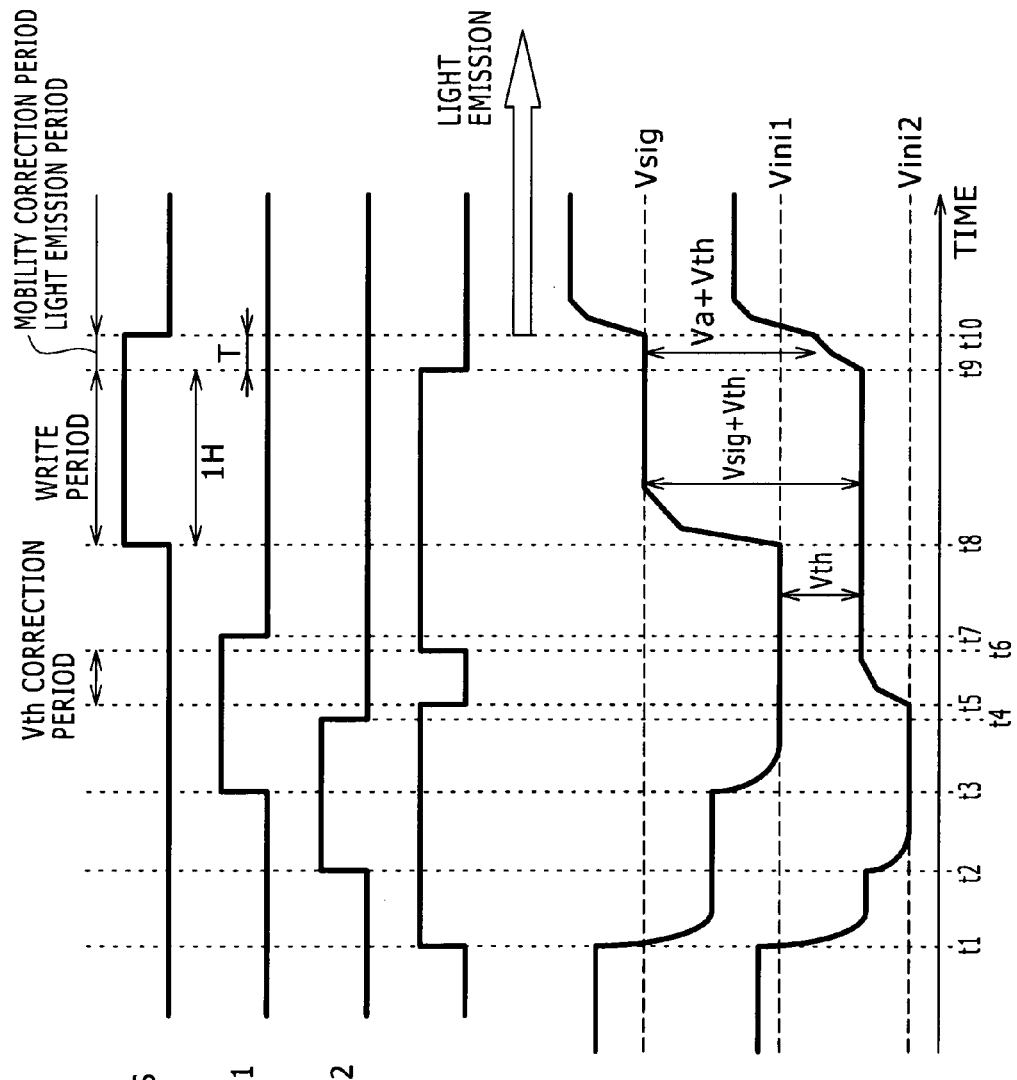
FIG. 4 is a timing waveform diagram for describing the circuit operation of the active matrix organic EL display device according to the present invention.

FIG. 4 illustrates the timing relationship between the write signal WS (WS1 to WSm) given to the pixel 20 by the write scan circuit 40, the drive signal DS (DS1 to DSm) given to the pixel 20 by the drive scan circuit 50, and the first and second correction scan signals AZ1 (AZ11 to AZ1*m*) and AZ2 (AZ21 to AZ2*m*) given to the pixel 20 by the first and second correction scan circuits 60 and 70, and the changes of the gate potential Vg and source potential Vs of the drive transistor 22 when the pixels 20 on a column are driven.

Here, the write transistor 23 and switching transistors 25 and 26 are N-channel transistors. Therefore, the write signal WS and first and second correction scan signals AZ1 and AZ2 are in an active state at high level (source potential VDD in this example; hereinafter written as "H" level) and in an inactive state at low level (source potential VSS (GND) in this example; hereinafter written as "L" level). Further, the switching transistor 24 is a P-channel transistor. Therefore, the drive signal DS is in an active state at "L" level and in an inactive state at "H" level.

At time t1, the drive signal DS changes from "L" level to "H" level, bringing the switching transistor 24 out of conduction. At time t2, the second correction scan signal AZ2 changes from "L" level to "H" level, bringing the switching transistor 26 into conduction. As a result, the source potential Vini2 is applied to the source of the drive transistor 22 via the switching transistor 26.

At this time, the level relationship, Vini2<Vcat+Vthel, holds as mentioned earlier. Therefore, the organic EL element 21 is in a reverse-biased state. As a result, no current flows through the organic EL element 21, causing it not to emit light.

Next, at time t3, the first correction scan signal AZ1 changes from "L" level to "H" level, bringing the switching transistor 25 into conduction. Therefore, the source potential Vini1 is applied to the gate of the drive transistor 22 via the switching transistor 25. At this time, the gate-to-source voltage Vgs of the drive transistor 22 takes on the value of Vini1−Vini2. Here, the level relationship, Vini1−Vini2>Vth, is satisfied.

(Vth Correction Period)

Next, at time t4, the second correction scan signal AZ2 changes from "H" level to "L" level, bringing the switching transistor 26 out of conduction. Then, at time t5, the drive signal DS changes from "H" level to "L" level, bringing the switching transistor 24 into conduction. As a result, a current appropriate to the gate-to-source potential difference Vgs of the drive transistor 22 flows through the drive transistor 22.

At this time, the cathode potential Vcat (source potential VSS) of the organic EL element 21 is higher than the source potential Vs of the drive transistor 22. Therefore, the organic EL element 21 is in a reverse-biased state. As a result, the current from the drive transistor 22 flows in the following order, i.e., the node N11, holding capacitance 27, node N12, switching transistor 25, and source potential Vini1. Therefore, a charge appropriate to the current is stored in the holding capacitance 27. On the other hand, as the holding capacitance 27 is charged, the source potential Vs of the drive transistor 22 will rise gradually from the source potential Vini2 over time.

Then, when, after elapse of a given time, the gate-to-source (N11-to-N12) potential difference Vgs of the drive transistor 22 becomes equal to the threshold voltage Vth of the same drive transistor 22, the same drive transistor 22 will go into cutoff. Therefore, a current stops flowing through the drive transistor 22. As a result, the gate-to-source (N11-to-N12) potential difference Vgs of the drive transistor 22, i.e., the threshold voltage Vth, is held by the holding capacitance 27 as a threshold correction potential.

Then, at time t6, the drive signal DS changes from "L" level to "H" level, bringing the switching transistor 24 out of conduction. This period from time t5 to time t6 is a period of time during which the threshold voltage Vth of the drive transistor 22 is detected and held by the holding capacitance 27. Here, this given period t5 to t6 will be referred to as the Vth correction period for the sake of convenience. Then, at time t7, the first correction scan signal AZ1 changes from "H" level to "L" level, bringing the switching transistor 25 out of conduction.

(Write Period)

Next, at time t8, the write signal WS changes from "L" level to "H" level, causing the write transistor 23 to sample the input signal voltage Vsig and write this signal to the pixel. As a result, the gate potential Vg of the drive transistor 22 becomes equal to the input signal voltage Vsig. The input signal voltage Vsig is held by the holding capacitance 27.

At this time, the source potential Vs of the drive transistor 22 rises due to the capacitive coupling between the holding capacitance 27 and organic EL element 21 relative to the amplitude of the gate potential Vg of the drive transistor 22 at the time of sampling by the write transistor 23. The increment ΔVs of the source potential Vs of the drive transistor 22 is expressed by the formula (2) mentioned earlier.

The input signal voltage Vsig written by the write transistor 23 is held by the holding capacitance 27 so that the input signal voltage Vsig is added to the threshold voltage Vth held by the holding capacitance 27. At this time, the voltage held by the holding capacitance 27 is equal to Vsig−Vini1+Vth. Here, for easier understanding, we assume that Vini1=0 V. Then, the gate-to-source voltage Vgs is equal to Vsig+Vth.

As described above, the variation of the threshold voltage Vth of the drive transistor 22 between pixels and the change of the threshold voltage Vth over time can be corrected by holding the threshold voltage Vth in the holding capacitance 27 in advance. That is, when the drive transistor 22 is driven by the input signal voltage Vsig, the threshold voltage Vth of the drive transistor 22 and the threshold voltage Vth held by the holding capacitance 27 cancel each other. In other words, the threshold voltage Vth is corrected.

This correction operation of the threshold voltage Vth permits cancellation of the impact of the threshold voltage Vth on the driving of the organic EL element 21 by the drive transistor 22 even if there is a variation of the threshold voltage Vth between pixels or a change of the threshold voltage Vth over time. As a result, the light emission brightness of the organic EL element 21 can be maintained constant without being affected by the variation of the threshold voltage Vth or the change thereof over time.

(Mobility Correction Period)

Then, at time t9, the drive signal DS changes from "H" level to "L" level with the write transistor 23 remaining in conduction, bringing the switching transistor 24 into conduction. As a result, the supply of a current from the source potential VDD to the drive transistor 22 begins. It should be noted that this period from time t8 to time t9 is one horizontal interval (1H). Here, the organic EL element 21 is put into a reverse-biased state by setting Vini1−Vth<Vthel.

When the organic EL element 21 is put into a reverse-biased state, the organic EL element 21 exhibits a simple capacitive characteristic rather than diode characteristic. Therefore, the drain-to-source current Ids flowing through the drive transistor 22 is written to a combined capacitance C (=Ccs+Coled) of the capacitance value Ccs of the holding capacitance 27 and the capacitance value Coled of the organic EL element 21. This writing causes the source potential Vs of the drive transistor 22 to rise.

The increment ΔVs of the source potential Vs of the drive transistor 22 acts so that it is subtracted from the gate-to-source potential difference Vgs of the drive transistor 22 held by the holding capacitance 27, in other words, in such a manner as to discharge the charge stored in the holding capacitance 27. This means that a negative feedback is applied. That is, the increment ΔVs of the source potential Vs of the drive transistor 22 is a feedback amount of the negative feedback. At this time, the gate-to-source potential difference Vgs of the drive transistor 22 is Vsig−ΔVs+Vth.

As described above, if the current flowing through the drive transistor 22 (drain-to-source current Ids) is negatively fed back to the gate input (gate-to-source potential difference) of the drive transistor 22, the dependence of the drain-to-source current Ids of the drive transistor 22 on the mobility μ in each of the pixels 20 can be cancelled. That is, the variation of the mobility μ of the drive transistor 22 can be corrected.

A period T (t9 to t10) during which the active period of the write signal WS ("H" level period) and the active period of the drive signal DS ("L" level period) overlap, namely, the overlapping period during which the write transistor 23 and switching transistor 24 are both conducting, is referred to as a mobility correction period.

Here, a drive transistor with the high mobility μ and another drive transistor with the low mobility μ are considered. The source potential Vs of the drive transistor with the high mobility μ rises sharply as compared to that of the drive transistor with the low mobility μ in this mobility correction period T. Further, the larger the source potential Vs is, the smaller the gate-to-source potential difference of the drive transistor 22 becomes. As a result, a current is less likely to flow.

That is, it is possible to cause the same drain-to-source current Ids to flow through the drive transistors 22 with the different mobilities μ by adjusting the mobility correction period T. The gate-to-source potential difference Vgs of the drive transistor 22 determined in the mobility correction period T is retained by the holding capacitance 27. The current (drain-to-source current Ids) appropriate to the gate-to-source potential difference Vgs flows from the drive transistor 22 to the organic EL element 21. This allows the organic EL element 21 to emit light.

(Light Emission Period)

At time t10, the write signal WS falls to "L" level, bringing the write transistor 23 out of conduction. As a result, the mobility correction period T ends, and a light emission period begins. In the light emission period, the source potential Vs of the drive transistor 22 rises to the driving voltage of the organic EL element 21. As a result of the rise of the source potential Vs, the gate of the drive transistor 22 is disconnected from the signal line 35 (35-1 to 35-n) and left in a floating state. Therefore, the gate potential Vg will also rise via the holding capacitance 27.

At this time, letting the parasitic capacitance of the gate of the drive transistor 22 be denoted by Cg, the increment ΔVg of the gate potential Vg is expressed by the following formula (3):

$$\Delta Vg = \Delta Vs \times \{Ccs/(Ccs+Cg)\} \qquad (3)$$

During this period, the gate-to-source potential difference Vgs held in the holding capacitance 27 maintains the value of Vsig−ΔVs+Vth.

Then, as the source potential Vs of the drive transistor 22 rises, the reverse bias is removed from the organic EL element 21. Therefore, the constant drain-to-source current Ids given by the aforementioned formula (1) flows from the drive transistor 22 to the organic EL element 21, causing the organic EL element 21 to actually start emitting light.

The relationship between the drain-to-source current Ids and gate-to-source potential difference Vgs at this time is given by the following formula (4) by substituting Vsig−ΔVs+Vth into Vgs in the formula (1).

$$Ids = k\mu(Vgs - Vth)^2 \quad (4)$$
$$= k\mu(Vsig - \Delta V)^2$$

In the above formula (4), k=(1/2)(W/L)Cox.

As is clear from the formula (4), the term of the threshold voltage Vth of the drive transistor 22 is cancelled. The drain-to-source current Ids supplied from the drive transistor 22 to the organic EL element 21 is independent of the threshold voltage Vth of the drive transistor 22. Basically, the drain-to-source current Ids is determined by the input signal voltage Vsig. In other words, the organic EL element 21 emits light at the brightness appropriate to the input signal voltage Vsig without being affected by the variation of the threshold voltage Vth of the drive transistor 22 or the change thereof over time.

Further, as is clear from the formula (4), the input signal voltage Vsig is corrected with the feedback amount ΔVs by negatively feeding back the drain-to-source current Ids to the gate input of the drive transistor 22. The feedback amount ΔVs acts to cancel the effect of the mobility μ in the coefficient part of the formula (4). Therefore, the drain-to-source current Ids is substantially dependent only on the input signal voltage Vsig. That is, the organic EL element 21 emits light at the brightness appropriate to the input signal voltage Vsig without being affected by the variation of the threshold voltage Vth of the drive transistor 22 or mobility μ of the drive transistor 22 or the change thereof over time. This provides uniform image quality free from banding or uneven brightness.

Here, in the active matrix display device having the pixels 20, containing a current-driven electro-optical element, i.e., the organic EL element 21, arranged in a matrix form, if the light emission time of the organic EL element 21 is long, the I-V characteristic of the organic element 21 will change. For this reason, the connection node N11 between the anode electrode of the organic EL element 21 and the source of the drive transistor 22 will also change in potential.

In contrast, in the active matrix organic EL display device 10 configured as described above, the gate-to-source potential difference Vgs of the drive transistor 22 is maintained constant. For this reason, the current flowing through the organic EL element remains unchanged. Therefore, the constant drain-to-source current Ids will continue to flow through the organic EL element 21 even if the I-V characteristic of the organic EL element 21 deteriorates. As a result, the light emission brightness of the organic EL element 21 will remain unchanged (compensation function for a characteristic change of the organic EL element 21).

Further, the threshold voltage Vth of the drive transistor 22 is held by the holding capacitance 27 before the writing of the input signal voltage Vsig. As a result, the threshold voltage Vth of the drive transistor 22 can be cancelled (corrected) so that the constant drain-to-source current Ids flows through the organic EL element 21 without being affected by the variation of the threshold voltage Vth or the change thereof over time. This provides a high quality display image (compensation function for the variation of Vth of the drive transistor 22).

Still further, in the mobility correction period t9 to t10, the drain-to-source current Ids is negatively fed back to the gate input of the drive transistor 22 so that the input signal voltage Vsig is corrected with the feedback amount ΔVs. As a result, the dependence of the drain-to-source current Ids of the drive transistor 22 on the mobility μ is cancelled, thus allowing the drain-to-source current Ids, which is dependent only on the input signal voltage Vsig, to flow through the organic EL element 21. This ensures uniform display image quality free from banding or uneven brightness caused by the variation of the mobility μ of the drive transistor 22 or the change thereof over time (compensation function for the mobility μ of the drive transistor 22).

Incidentally, if the capacitance value Coled of the organic EL element 21 is sufficiently larger than the capacitance value Ccs of the holding capacitance 27, the increment ΔVs of the source potential Vs of the drive transistor can be suppressed when the gate potential Vg of the drive transistor rises as described earlier. Therefore, when sufficiently larger than the capacitance value Ccs, the capacitance value Coled is advantageous in providing the large gate-to-source potential difference Vgs of the drive transistor.

For this reason, the present invention is characterized in that it permits the capacitance value Coled of the organic EL element 21 to be arbitrarily set without changing the light extraction efficiency of the pixel 20 so that the capacitance value Coled of the organic EL element 21 can be set sufficiently larger than the capacitance value Ccs of the holding capacitance 27.

(Pixel Structure)

Figure 5:
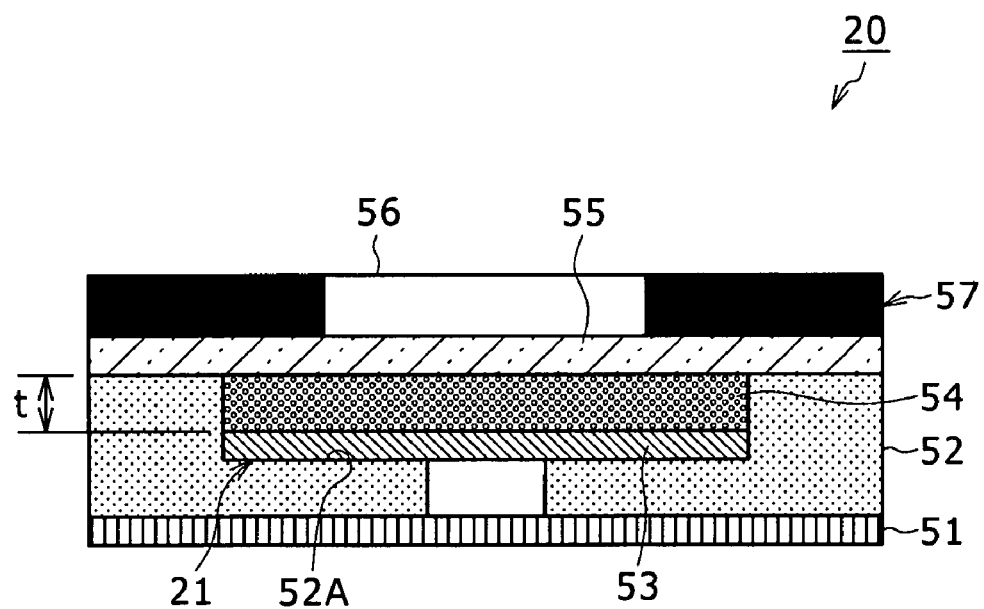
FIG. 5 is a sectional view illustrating an example of sectional structure of the pixel.

FIG. 5 is a sectional view illustrating an example of sectional structure of the pixel 20. As illustrated in FIG. 5, the pixel 20 includes a substrate 51 on which the drive transistor 22, write transistor 23, switching transistors 24 to 26 and other components are formed. The pixel 20 further includes an insulating film 52 formed on the substrate 51 and is configured to have the organic EL element 21 disposed in a concave portion 52A of the insulating film 52.

The organic EL element 21 includes a first electrode (e.g., anode electrode) 53 made up of a metal or other substance formed on the bottom portion of the concave portion 52A of the insulating film 52. The organic EL element 21 further includes an organic layer 54 formed on the first electrode 53 and a second electrode (e.g., cathode electrode) 55 formed commonly for all the pixels on the organic layer 54 and made up, for example, of a transparent conductive film.

In the organic EL element 21, the organic layer 54 is formed by stacking a hole transporting layer, light-emitting layer, electron transporting layer and electron injection layer successively in this order on the first electrode 53. Then, a current flows from the drive transistor 22 shown in FIG. 2 to the organic layer 54 via the first electrode (anode electrode) 53. This causes electrons and holes to recombine in the light-emitting layer of the organic layer 54, thus causing light to be emitted.

On the top surface of the organic EL element 21, i.e., the top surface of the second electrode (transparent electrode) 55 is formed with a light-shielding film 57 which is referred to as so-called "black matrix." The light-shielding film 57, which is patterned on a pixel-by-pixel basis, forms a light extraction opening 56 whose opening area is smaller than the light emission area of the organic EL element 21, i.e., the surface area of the organic layer 54. The light-shielding film 57 acts to suppress the optical interference between the adjacent pixels, thus providing improved contrast ratio.

That is, when the organic EL element 21 emits light, the area from which light can be extracted is the opening area of the light extraction opening 56 where the light-shielding film 57 is not disposed. That is, light cannot be extracted from the organic EL element 21 located where the light-shielding film 57 is disposed, in other words, outside the light extraction opening 56 even if the organic EL element 21 emits light. That is, the opening area of the light extraction opening 56 is the light emission area of the pixel 20.

Figure 6:
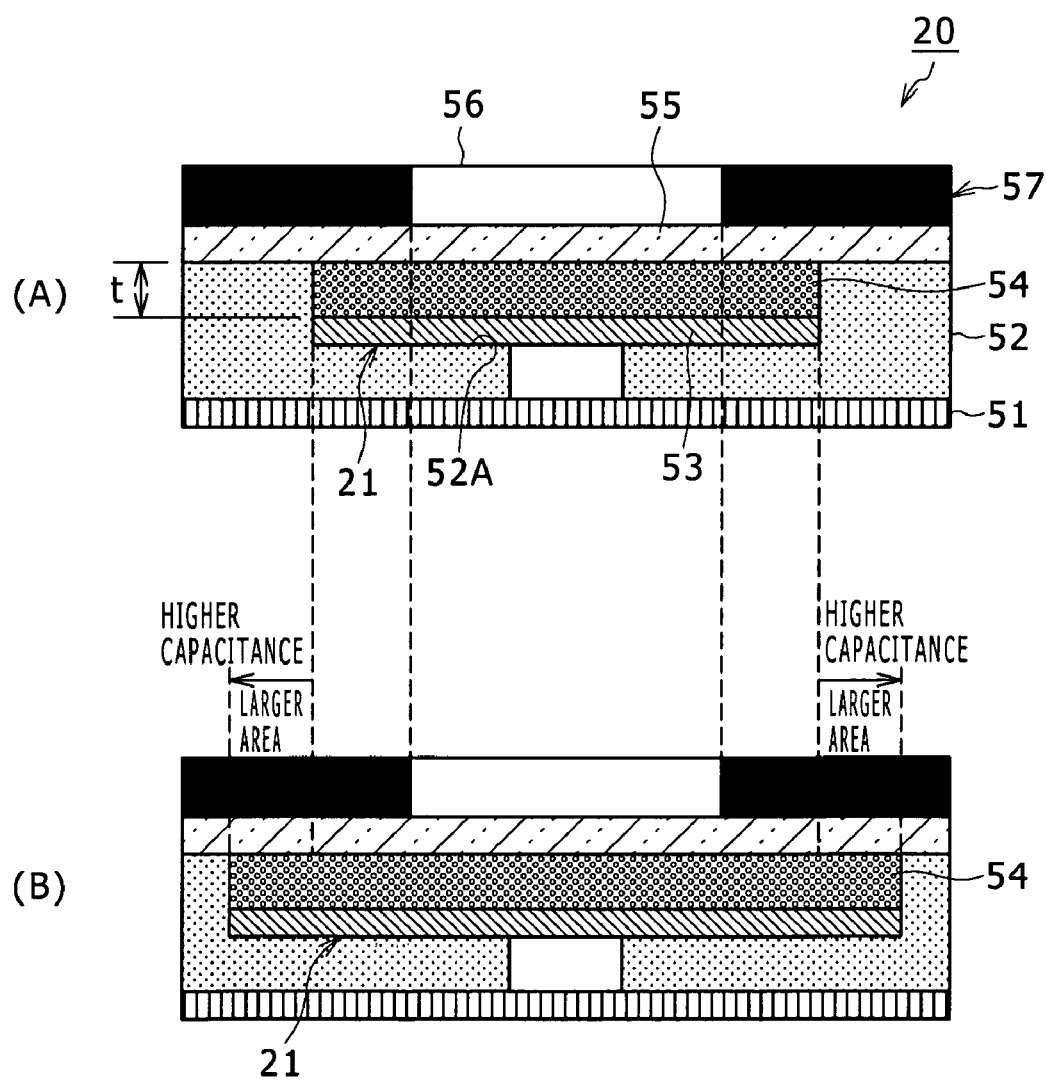
FIG. 6 is a view illustrating the relationship between the change in light emission area of an organic EL element and the change in a capacitance value Coled thereof.

In the pixel 20 configured as described above, the capacitance value Coled of the organic EL element 21 is proportional to the light emission area of the organic EL element 21 (surface area of the organic layer 54). Therefore, the capacitance value Coled of the organic EL element 21 can be increased by increasing the light emission area of the organic EL element 21. More specifically, if the light emission area of the organic EL element 21 is increased from the condition in FIG. 6A to that in FIG. 6B, the capacitance value Coled of the organic EL element 21 will increase by as much as the light emission area is increased (higher EL capacitance).

Even if the light emission area of the organic EL element 21 is increased, the light extraction efficiency of the pixel 20 will remain the same as before the light emission area of the organic EL element 21 is increased. The reason for this is as follows. That is, when the light emission area of the organic EL element 21 is increased, the area of the organic layer 54 will spread out under the light-shielding film 57. The light emitted by the spread portion is shielded by the light-shielding film 57. Therefore, the light extraction efficiency of the pixel 20 is determined by the opening area of the light extraction opening 56, irrespective of the light emission area of the organic EL element 21 (surface area of the organic layer 54).

As described above, the organic EL display device has the pixels 20 arranged in a matrix form. The pixel 20 has the light extraction opening 56 formed therein whose opening area is smaller than the light emission area of the organic EL element 21. The light extraction opening 56 is formed by the light-shielding film (black matrix) 57 on the pixel surface. In this organic EL display device, the capacitance value Coled of the organic EL element 21 can be arbitrarily set by adjusting the light emission area of the organic EL element 21. This permits the capacitance value Coled of the organic EL element 21 to be set sufficiently larger than the capacitance value Ccs of the holding capacitance 27 without changing the light extraction efficiency of the pixel 20.

If the capacitance value Coled of the organic EL element is sufficiently larger than the capacitance value Ccs of the holding capacitance, the increment ΔVs of the source potential Vs can be suppressed when the gate potential Vg of the drive transistor 22 rises as is clear from the formula (2). This provides the large gate-to-source potential difference Vgs of the drive transistor 22.

As described above, if the large gate-to-source potential difference Vgs of the drive transistor 22 can be provided at the time of writing of the input signal voltage Vsig by the write transistor 22, the amplitude of the input signal voltage Vsig written to the pixel 20 can be reduced to the same extent. Hence, the horizontal drive circuit 80, adapted to supply the input signal voltage Vsig to each pixel 20 on the row selected by the write scan circuit 40 via the signal line 35 (35-1 to 35-n), can be reduced in power consumption. As a result, the display device as a whole can be reduced in power consumption.

On the other hand, if, in the color organic EL display device, the pixels 20 are arranged so that at least two colors, and for example three colors, namely, R (red), G (greed) and B (blue), are grouped as one unit, the organic EL elements 21 adapted to emit the respective colors have the different capacitance values Coled because they are made of different materials and have different film thicknesses.

In the organic EL element 21 whose structure is shown in FIG. 5, the emission color is determined, for example, by the material used to form the light-emitting layer of the organic layer 54 and a thickness t of the organic layer 54. In other words, the organic EL elements adapted to emit each color of R, G and B differ in the material of the organic EL element or film thickness t from one another. The difference in the material of the organic EL element or film thickness t changes the capacitance Coled of the organic EL element. That is, the difference in the material or film thickness t between the organic EL elements adapted to emit the respective colors leads to a difference in the capacitance Coled therebetween.

As an example, the relationship in magnitude of the film thickness t of the organic EL element, R>G>B, holds because of the relationship in magnitude of wavelength (R>G>B) between the three colors of R, G and B. Therefore, the relationship in magnitude of the capacitance Coled of the organic EL element, B>G>R, holds, with B having the largest capacitance Coled, which is the opposite of the film thickness. The ratio of capacitance is, for example, R:G:B=1:1.2:1.5.

For this reason, the light emission area is adjusted for each of the organic EL elements adapted to emit each color of R, G and B. For example, the light emission areas of G and R are increased successively in this order relative to the light emission area of B so that the capacitance Coled of the organic EL element is the same for all the colors. As a result, when the gate potential Vg of the drive transistor 22 rises as a result of the writing of the signal voltage Vsig by the write transistor 23 through sampling, the increment ΔVs of the source potential Vs of the drive transistor 22 resulting from the coupling of the holding capacitance 27 and the capacitance of the organic EL elements 21 will be the same between each pixel of R, G and B.

Further, if the capacitance Coled of the organic EL element 21 is different depending on the emission color, the increment ΔVs of the source potential Vs of the drive transistor 22 will be different between R, G and B even when the increment ΔVg of the gate potential Vg of the drive transistor 22 is the same for R, G and B, as is clear from the formula (2) described earlier. As a result, even if the input signal voltage Vsig of the same level (voltage value) is fed to each R, G and B pixel, the drive voltages of each R, G and B organic EL element will not reach the voltage value appropriate to the signal voltage Vsig, thus resulting in an improper white balance.

The term "improper white balance" means that even if the input signal voltage Vsig adapted to display white is fed to each R, G and B pixel, the display colors of each R, G and B pixel will not combine into completely white. An improper white balance makes it impossible to produce images with natural-looking color.

Also in such a case, the light emission area is varied between the organic EL elements adapted to emit each color of R, G and B (between the pixels emitting the different colors). By doing so, the change between the gate-to-source potential difference Vgs when the input signal is written and the gate-to-source potential difference Vgs when the organic EL element 21 emits light is adjusted. As a result, the drive voltages of the organic EL elements 21 of the respective colors will be voltage values appropriate to the input signal voltage Vsig in accordance with the input of the input signal voltage Vsig of the same level. This ensures that the drive current values of the organic EL elements 21 of the respective colors will be approximately the same, thus allowing maintaining a proper white balance. As a result, images with more natural-looking color can be produced.

Here, red, green and blue were used as a plurality of the three basic colors as a unit for image display. However, the present invention is not limited to the combination of these three colors, but other color such as white may be added to the three colors to produce a four-color combination. Alternatively, other colors may be combined together.

It should be noted that the pixel circuit (pixel) of the organic EL display device to which the present invention is applicable is not limited to the example of the pixel circuit shown in FIG. 2. Instead, the present invention is applicable to all circuits in which the source potential Vs of the drive transistor 22 rises because of the coupling of the holding capacitance 22 and the capacitance of the organic EL element 21 at the time of writing of the signal to the gate of the drive transistor 22.

Further, although the above embodiment has been described taking, as an example, a case in which the present invention is applied to the organic EL display device using the organic EL element 21 as an electro-optical element of the pixel 20, the present invention is not limited to this application example. Instead, the present invention is applicable to all display devices in general using current-driven electro-optical elements (luminescence elements) whose light emission brightness changes with change in a current value flowing through the device.

APPLICATION EXAMPLES

The display device according to the present invention described above is applicable as a display device of electronic equipment across all fields including those shown in FIGS. 7 to 11, namely, a digital camera, laptop personal computer, mobile terminal device such as mobile phone and video camcorder. These pieces of equipment are designed to display an image or video of a video signal fed to or generated inside the electronic equipment. Examples of electronic equipment to which the present invention is applied will be described below.

It should be noted that the display device according to the present invention includes that in a modular form having a sealed configuration. For example, such a display device corresponds to a display module formed by attaching an opposed section made, for example, of transparent glass to the pixel array section 30. The aforementioned light-shielding film may be provided on the transparent opposed section, in addition to films such as color filter and protective film. It should be noted that a circuit section, FPC (flexible printed circuit) or other circuitry, adapted to allow exchange of signals or other information between external equipment and the pixel array section, may be provided on the display module.

Figure 7:
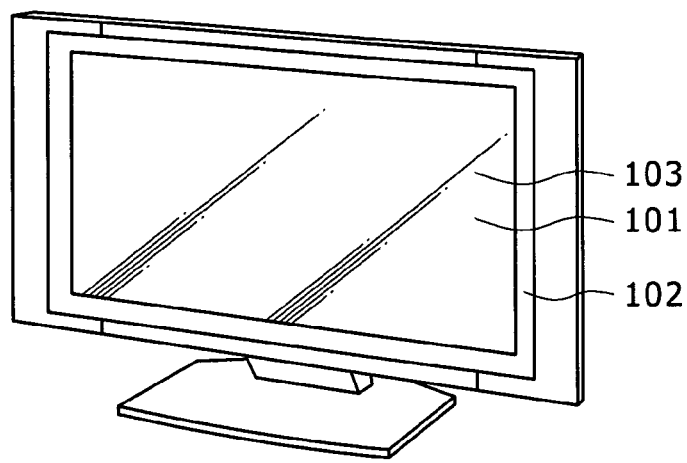
FIG. 7 is a perspective view illustrating a television set to which the present invention is applied.

FIG. 7 is a perspective view illustrating a television set to which the present invention is applied. The television set according to the present application example includes a video display screen section 101 made up, for example, of a front panel 102, filter glass 103 and other parts. The television set is manufactured by using the display device according to the present invention as the video display screen section 101.

Figure 8:
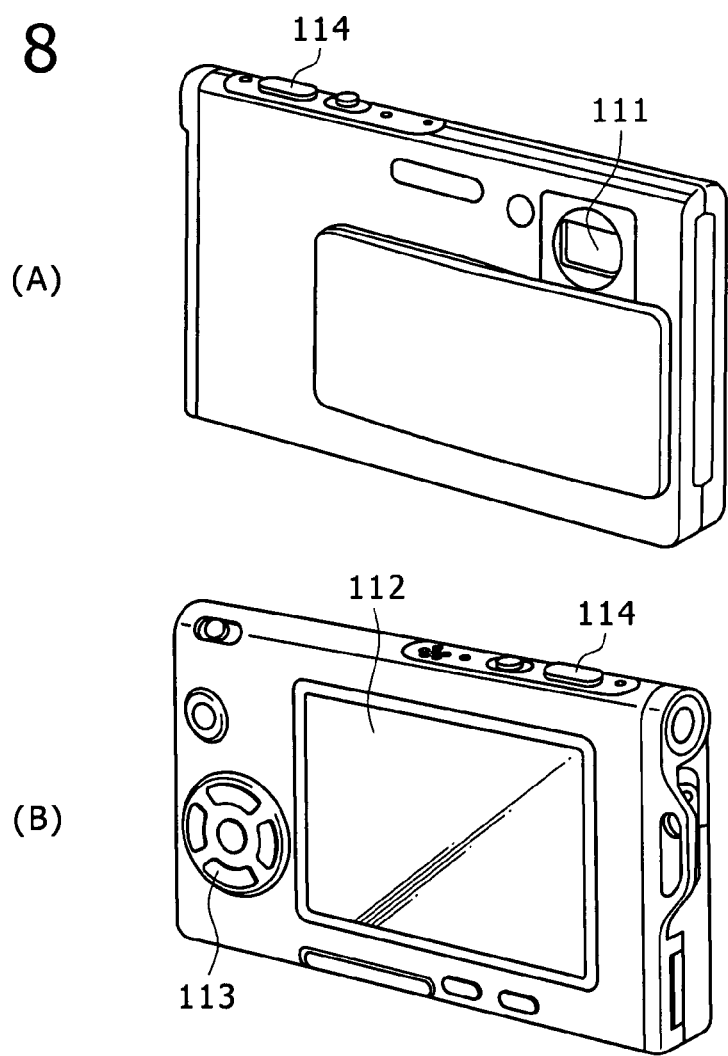
FIG. 8 is a perspective view illustrating a digital camera, to which the present invention is applied, and (A) is a perspective view as seen from the front, and (B) is a perspective view as seen from the rear.

FIG. 8 is a perspective view illustrating a digital camera to which the present invention is applied. (A) is a perspective view of the digital camera as seen from the front side, and (B) is a perspective view thereof as seen from the rear side. The digital camera according to the present application example includes a light-emitting section 111 for flash, display section 112, menu switch 113, shutter button 114 and other parts. The digital camera is manufactured by using the display device according to the present invention as the display section 112.

Figure 9:
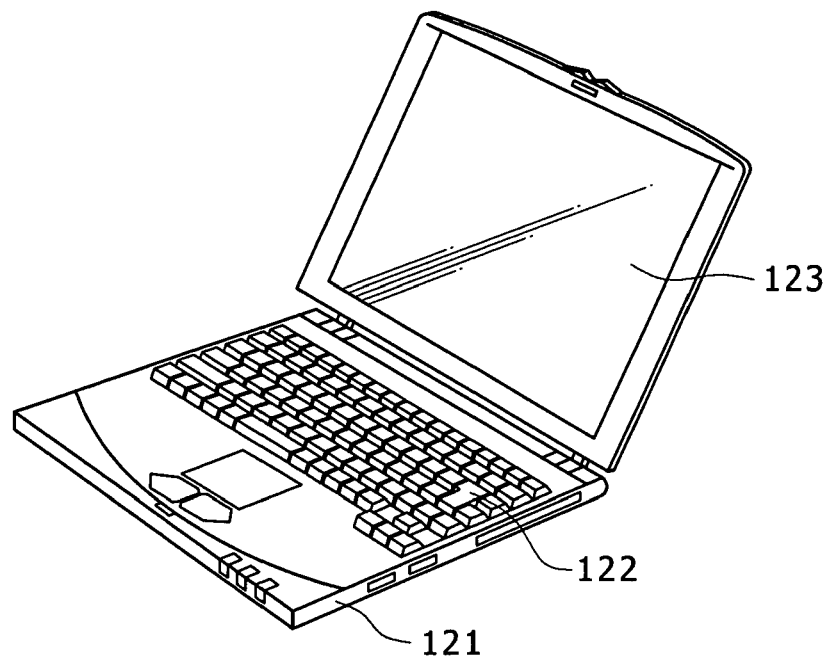
FIG. 9 is a perspective view illustrating a laptop personal computer to which the present invention is applied.

FIG. 9 is a perspective view illustrating a laptop personal computer to which the present invention is applied. The laptop personal computer according to the present application example includes, in a main body 121, a keyboard 122 adapted to be manipulated for entry of text or other information, a display section 123 adapted to display an image, and other parts. The laptop personal computer is manufactured by using the display device according to the present invention as the display section 123.

Figure 10:
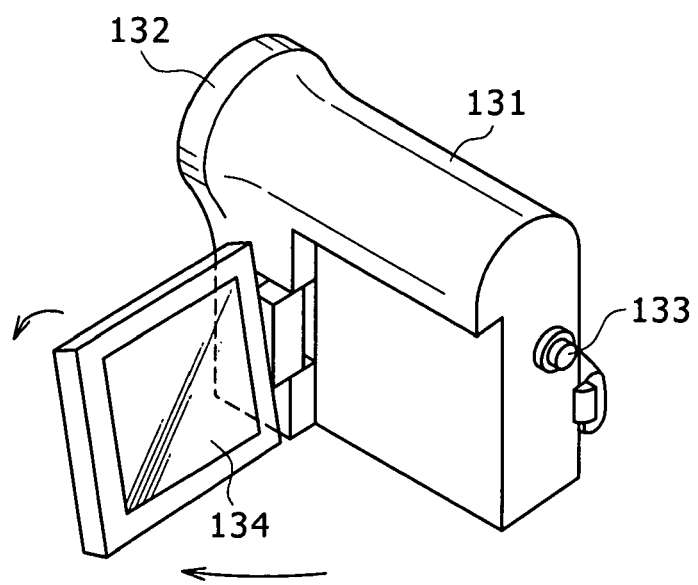
FIG. 10 is a perspective view illustrating a video camcorder to which the present invention is applied.

FIG. 10 is a perspective view illustrating a video camcorder to which the present invention is applied. The video camcorder according to the present application example includes a main body section 131, lens 132 provided on the front-facing side surface to image the subject, imaging start/stop switch 133, display section 134 and other parts. The video camcorder is manufactured by using the display device according to the present invention as the display section 134.

FIG. 11 is a perspective view illustrating a mobile terminal device such as mobile phone to which the present invention is applied. (A) is a front view of the mobile phone in an open position. (B) is a side view thereof. (C) is a front view of the mobile phone in a closed discharge. (D) is a left side view. (E) is a right side view. (F) is a top view. (G) is a bottom view. The mobile phone according to the present application example includes an upper enclosure 141, lower enclosure 142, connecting section (hinge section in this example) 143, display 144, sub-display 145, picture light 146, camera 147 and other parts. The mobile phone is manufactured by using the display device according to the present invention as the display 144 and sub-display 145.

The present invention permits the capacitance value of the electro-optical element to be arbitrarily set without changing the light extraction efficiency of the pixel by adjusting the light emission area of the electro-optical element.

The invention claimed is:

1. A display device having pixels arranged in a matrix form, each of the pixels comprising:
    an electro-optical element;
    a drive transistor adapted to drive the electro-optical element;
    a holding capacitance adapted to hold an input signal voltage supplied to the drive transistor; and
    a light-shielding film disposed adjacent to a light extraction area, the light extraction area being smaller than a light emission area of the electro-optical element, wherein
    a capacitance value of the electro-optical element formed by the light emission area of the electro-optical element is set larger than a capacitance value of the holding capacitance,
        a unit includes at least two pixels that have different light emission areas associated with different emission colors, and
        the capacitance value of the electro-optical element is the same for the pixels in the unit.

2. A display device having pixels, each of the pixels comprising at least:
    an electro-optical element; and
    a light-shielding film disposed adjacent to a light extraction area, the light extraction area being smaller than a light emission area of the electro-optical element, wherein
    the pixels are arranged in a matrix form so that at least two electro-optical elements having different light emission areas are grouped as a unit, and
    capacitance values of the electro-optical elements of the pixels are set equal to each other by the light emission areas.

3. An electro-optical element driving method for driving an electro-optical element adapted to emit light according to a current, the electro-optical element driving method comprising:

holding an input voltage to be supplied to a gate of a drive transistor in a holding capacitance connected between the gate and a connection node on a source side of the drive transistor;

supplying a current appropriate to the input voltage held by the holding capacitance from the drive transistor to the electro-optical element which is connected to the connection node on the source side and has the capacitance value larger than that of the holding capacitance;

causing the electro-optical element to emit light via a light extraction area where the light extraction area is smaller than the light emission area of the electro-optical element;

composing a unit including at least two pixels that have different light emission areas associated with different emission colors; and setting the capacitance value of the electro-optical element the same for the pixels in the unit.

4. An electro-optical element driving method for driving a plurality of electro-optical elements adapted to emit different colors as a unit, the electro-optical element driving method comprising:

supplying a drive current of approximately identical value to the electro-optical elements adapted to emit the respective colors whose light emission areas are different from each other;

causing the electro-optical elements adapted to emit the respective colors to emit light via light extraction areas where the light extraction areas are smaller than the light emission areas of the electro-optical elements;

composing a unit including at least two pixels that have different light emission areas associated with different emission colors; and setting the capacitance value of the electro-optical element the same for the pixels in the unit.

5. An electronic equipment having a display device, the display device having pixels arranged in a matrix form, each of the pixels comprising:

an electro-optical element;

a drive transistor adapted to drive the electro-optical element;

a holding capacitance adapted to hold an input signal voltage supplied to the drive transistor; and a light-shielding film disposed adjacent to a light extraction area, the light extraction area being smaller than a light emission area of the electro-optical element, wherein a capacitance value of the electro-optical element formed by the light emission area of the electro-optical element is set larger than a capacitance value of the holding capacitance, a unit includes at least two pixels that have different light emission areas associated with different emission colors, and the capacitance value of the electro-optical element is the same for the pixels in the unit.

6. The display device of claim 1, wherein the holding capacitance is connected to a connection node to which the electro-optical element and the drive transistor are connected.

7. The display device of claim 6, wherein the holding capacitance is connected between a gate of the drive transistor and a source of the drive transistor, and the connection node is disposed on the source of the drive transistor.

8. The electro-optical element driving method of claim 3 comprising:

driving the electro-optical elements and bringing drive currents of the electro-optical elements to approximately the same level by varying the light emission area between the electro-optical elements.

9. The display device according to claim 1, wherein each of the pixels in the unit has a different material and a different film thickness from other pixels in the unit.

10. The display device according to claim 2, wherein each of the pixels in the unit has a different material and a different film thickness from other pixels in the unit.

11. The electro-optical element driving method according to claim 3, further comprising providing each of the pixels in the unit to have a different material and a different film thickness from other pixels in the unit.

12. The electro-optical element driving method according to claim 4, further comprising providing each of the pixels in the unit to have a different material and a different film thickness from other pixels in the unit.

13. The electronic equipment according to claim 5, wherein each of the pixels in the unit has a different material and a different film thickness from other pixels in the unit.

* * * * *